United States Patent
Spencer et al.

(10) Patent No.: US 12,322,888 B2
(45) Date of Patent: Jun. 3, 2025

(54) DEVICE UNDER TEST BOARD WITH OFFSET CONNECTION TO HOST BOARD

(71) Applicant: Intel Corporation, Santa Clara, CA (US)

(72) Inventors: Keith Lyle Spencer, Boise, ID (US); Nicholas James Rally, San Mateo, CA (US); Victor Raúl Maruri, Mountain View, CA (US); Reed D. Vilhauer, Portland, OR (US); Brendan Rankin, Palo Alto, CA (US); Elizabeth Heidi Poche, San Jose, CA (US); Marcus Negron, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 920 days.

(21) Appl. No.: 17/033,531

(22) Filed: Sep. 25, 2020

(65) Prior Publication Data

US 2021/0013648 A1    Jan. 14, 2021

(51) Int. Cl.
| | | |
|---|---|---|
| *H01R 12/73* | (2011.01) | |
| *G01R 31/28* | (2006.01) | |
| *H01R 12/72* | (2011.01) | |

(52) U.S. Cl.
CPC ....... *H01R 12/737* (2013.01); *G01R 31/2808* (2013.01); *H01R 12/724* (2013.01)

(58) Field of Classification Search
CPC .......................... H01R 12/737; H01R 12/724; G01R 31/2808; G01R 31/31905; G01R 31/318516; G06F 13/4295
See application file for complete search history.

(56) References Cited

U.S. PATENT DOCUMENTS

| | | | | |
|---|---|---|---|---|
| 6,356,959 | B1* | 3/2002 | Thomas | G06F 13/4027 |
| | | | | 710/2 |
| 6,411,114 | B1* | 6/2002 | Grilletto | H01L 22/34 |
| | | | | 324/756.05 |
| 8,659,314 | B2* | 2/2014 | Li | G06F 11/2221 |
| | | | | 324/756.07 |
| 2013/0070411 | A1* | 3/2013 | Liang | G06F 1/185 |
| | | | | 361/679.31 |
| 2013/0103879 | A1* | 4/2013 | Wei | G06F 11/2733 |
| | | | | 710/316 |
| 2014/0354296 | A1 | 12/2014 | Yan | |

(Continued)

FOREIGN PATENT DOCUMENTS

CN    110221999 A  *  9/2019

OTHER PUBLICATIONS

English translation of CN 110221999 (Year: 2019).*

(Continued)

*Primary Examiner* — Feba Pothen
(74) *Attorney, Agent, or Firm* — Fletcher Yoder, PC (57) ABSTRACT

The present disclosure relates to a circuit board that includes a first edge connector configured to communicatively couple the circuit board to a first connector of a second circuit board. The first edge connector extends from a side of the circuit board a first length. The circuit board also includes a second edge connector configured to communicatively couple the circuit board to a second connector of the second circuit board. The second edge connector extends from the side of the circuit board a second length that is different than the first length.

20 Claims, 3 Drawing Sheets

(56) References Cited

U.S. PATENT DOCUMENTS

2016/0181712 A1    6/2016  Wig
2020/0065287 A1    2/2020  Grafe
2021/0389367 A1*  12/2021  Wu .......................... H05K 1/02

OTHER PUBLICATIONS

Zilberman, Noa, NetFPGA Sume: Toward 100 GBPS as Research Commodity, IEEE Micro, IEEE Service Center, Los Alamitos, CA, US,deel 34, nr. 5, Sep. 1, 2014.
International Search Report and Written Opinion for NL2029028, 7pages.

* cited by examiner

DEVICE UNDER TEST BOARD WITH OFFSET CONNECTION TO HOST BOARD

BACKGROUND

The present disclosure relates generally to a circuit board. More specifically, the present disclosure relates to a device under test (DUT) board utilized for software testing and debugging scenarios on integrated circuit devices such as programmable logic devices (e.g., field-programmable gate arrays (FPGAs)).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

DUT boards may be utilized when testing electronic circuits and electronic devices, such as integrated circuit devices. In some cases, DUT boards may serve as an interface between a device under test (e.g., an integrated circuit device disposed on a DUT board) and other electronic equipment, such as another circuit board (e.g., printed circuit board (PCB) and/or equipment utilized to test the device under test. However, in some cases, DUT boards may not include a sufficient number of connections and/or the desired type of connection(s) to communicatively couple the DUT board to the other circuit board or the equipment utilized to test the device under test.

BRIEF DESCRIPTION OF THE DRAWINGS

Advantages of the present disclosure may become apparent upon reading the following detailed description and upon reference to the drawings in which.

DETAILED DESCRIPTION OF SPECIFIC EMBODIMENTS

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical exclusive-OR (XOR)). In other words, the phrase A "or" B is intended to mean A, B, or both A and B.

The present disclosure generally relates to a device under test (DUT) board that may be utilized in testing integrated circuit devices. As a more specific example, the DUT board described herein may be utilized to test and troubleshoot programmable logic devices such as field-programmable gate arrays (FPGAs) and application-specific integrated circuits (ASICs). For instance, an FPGA may be placed onto a DUT board to test whether code (e.g., a program) properly compiles and that programmable logic elements of the FPGA are correctly programmed to provide a hardware implementation that performs the operations called for by the program. As described in more detail below, the DUT board may include several connectors that enable the DUT board to interface and communicate with other circuitry, such as a base board or host board.

Figure 1:
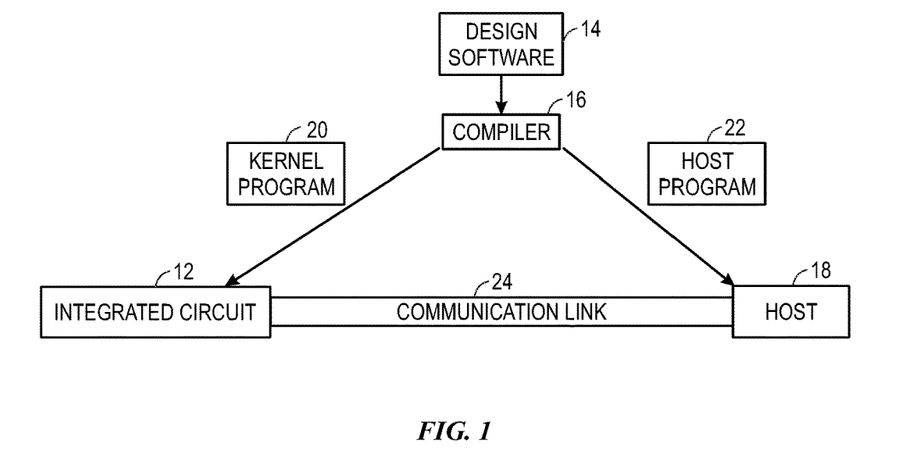
FIG. 1 is a block diagram of a system used to program an integrated circuit, in accordance with an embodiment.

With the foregoing in mind, FIG. 1 illustrates a block diagram of a system 10 that may implement arithmetic operations. A designer may desire to implement functionality on an integrated circuit 12 (e.g., a programmable logic device such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit 12 without specific knowledge of low-level hardware description languages (e.g., Verilog or VHDL). For example, since OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit 12.

The designer may implement high-level designs using design software 14, such as a version of INTEL® QUARTUS® by INTEL CORPORATION. The design software 14 may use a compiler 16 to convert the high-level program into a lower-level description. The compiler 16 may provide machine-readable instructions representative of the high-level program to a host 18 and the integrated circuit 12. The host 18 may receive a host program 22 which may be implemented by the kernel programs 20. To implement the host program 22, the host 18 may communicate instructions from the host program 22 to the integrated circuit 12 via a communications link 24, which may be, for example, direct memory access (DMA) communications or peripheral component interconnect express (PCIe) communications The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
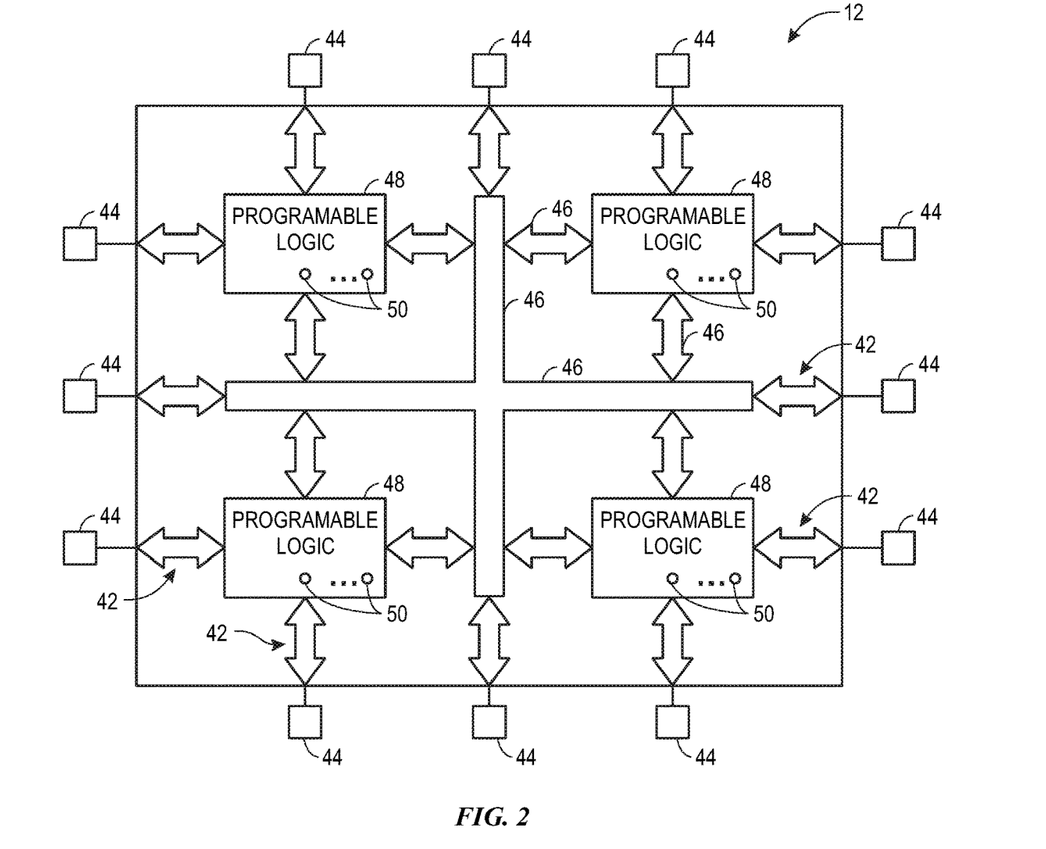
FIG. 2 is a block diagram of the integrated circuit of FIG. 1, in accordance with an embodiment.

Turning now to a more detailed discussion of the integrated circuit 12, FIG. 2 is a block diagram of an example of the integrated circuit 12 as a programmable logic device, such as a field-programmable gate array (FPGA). Further, it should be understood that the integrated circuit 12 may be any other suitable type of programmable logic device (e.g., an ASIC and/or application-specific standard product). As shown, integrated circuit 12 may have input/output circuitry 42 for driving signals off device and for receiving signals from other devices via input/output pins 44. Interconnection resources 46, such as global and local vertical and horizontal conductive lines and buses and/or configuration resources (e.g., hardwired couplings, logical couplings not implemented by user logic), may be used to route signals on integrated circuit 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit 12, may include programmable elements 50 with the programmable logic 48. For example, as discussed above, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
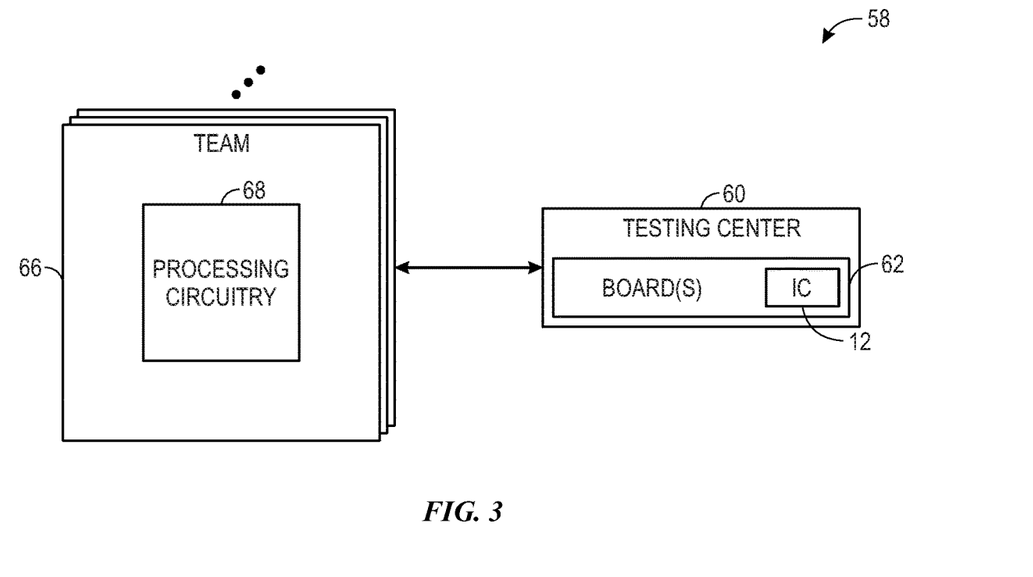
FIG. 3 is a block diagram of a testing system, in accordance with an embodiment.

As described above, a user (e.g., designer) may utilize the design software 14 to implement functionality on the programmable logic 48 of the integrated circuit 12. In particular, the designer may specify in a high-level programming language operations to be performed by the integrated circuit 12. The compiler 16 may convert the high-level program into a lower-level description that is used to program the programmable logic 48 to perform addition. Bearing this in mind, in some cases, the integrated circuit 12 may be included in a testing center that is utilized, for example, by teams within an entity to test whether program designs compile correctly (e.g., to generate instructions for the programmable logic 48 to be configured or reconfigured to perform one or more operations described in a program) and that the integrated circuit 12 performs the operations described by the program. For example, FIG. 3 illustrates a testing system 58 that may be utilized to test programs and designs to be implemented on integrated circuit devices, such as the integrated circuit 12. The testing system 58 includes a testing center 60 that includes circuit boards 62, which may include one or more device under test (DUT) boards onto which integrated circuit devices may be disposed (e.g., to be tested) as well as one or more base boards that may interface with the DUT board(s). The testing system also includes teams 66, which may be computing devices associated with a particular unit or subdivision within an organization. Each of the teams 66 may be communicatively couple to the testing center 60 and include processing circuitry 68 capable of executing computer-readable instructions. For example, the processing circuitry 68 may execute design software that is used to write programs to be implemented by integrated circuit devices. The testing center 60 may receive files for the programs and test whether the programs compile correctly and whether the integrated circuit 12, once programmed, operates properly. For example, the testing center 60 may include processing circuitry that implements that compiler 16, which may be compile instructions generated and sent by one of the teams 66. The testing center 60 may and compile the programs to generate instructions that can be utilized to program the integrated circuit 12, which may be done to test whether compiling occurred correctly and/or or test whether the programmable logic 48 of the integrated circuit device 12 has programmed in a way to successfully perform one or more functions called for the by the instructions.

Figure 4:
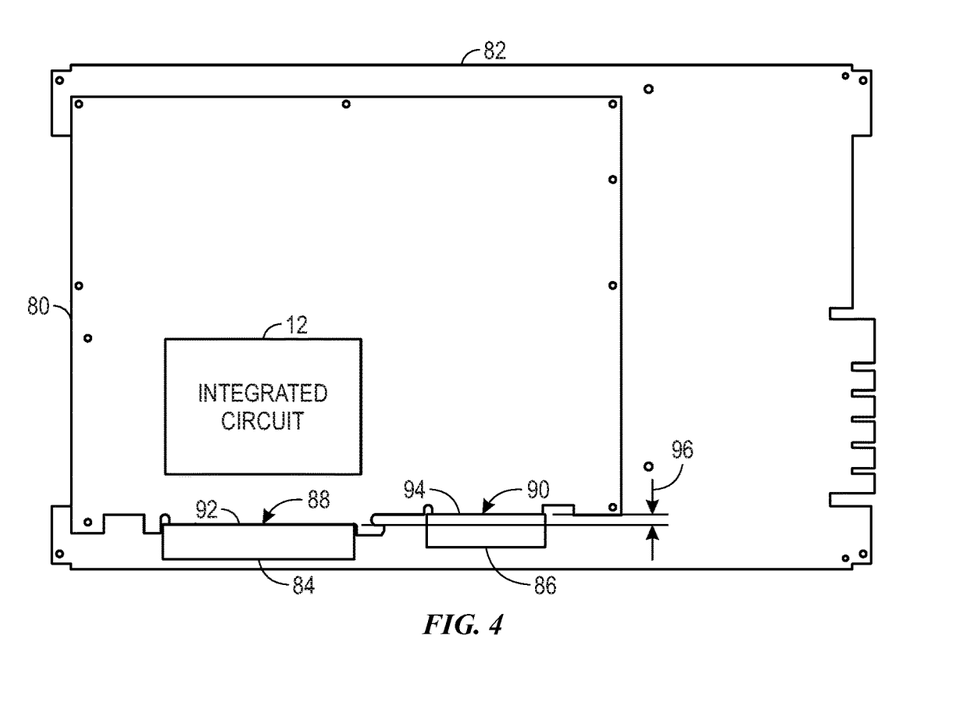
FIG. 4 is a diagram of circuit boards that may be included in the testing system of FIG. 3, in accordance with an embodiment.

Continuing with the drawings, FIG. 4 illustrates a DUT board 80 disposed on a host board 82, both of which may be included in the boards 62 of FIG. 3. More specifically, the testing center 60 may include many (e.g., tens, hundreds, thousands) of DUT boards 80 and host boards 82 to perform testing. In particular, the host board 82 may be housed in a server rack within the testing center 60, while the DUT board 80 may be added and/or removed from host board 82, depending on the nature and/or amount of tests to be conducted. The DUT board 80 may be utilized for performing functional test/firmware test (FTFW) functions, for example, relating to an integrated circuit (e.g., integrate circuit 12) disposed on the DUT board 80. In some embodiments, an integrated circuit may also be disposed on the host board 82. The DUT board 80 may be any board used to test firmware and/or software. The firmware may be tested using diagnostic software. The diagnostic software may be a simple software that allows for personnel to see if the firmware functions as intended. The firmware may vary depending on the DUT board 80 used for testing. The software may be sent to the testing center 60 from the teams 66, as discussed above. The software from the teams 66 may be different and more complex than that of the diagnostic software.

The DUT board 80 may form a board-to-board connection with the host board 82 via connectors 84, 86 of the host board 82 and edge connectors 88, 90 that may be inserted into the connectors 84, 86. Components on the DUT board 80 may be communicatively coupled to components on the host board 82 via the edge connectors 88, 90 and connectors 84, 86. For example, the connectors 84, 86 may be peripheral component interconnect express (PCIe) connectors into which the edge connectors 88, 90 may be inserted. More specifically, the connector 84 may be a PCIe x16 connector (e.g., having sixteen data lanes) designed to carry out protocol signaling and interfaces. The connector 86 may be a PCIe x8 connector capable of hosting eight data lanes. Additionally, the connectors 84, 86 may be right-angle connectors that enable the DUT board 80 to be positioned on top of, and substantially parallel to, the host board 82. In another embodiment, the connectors 84, 86 may be configured to receive the edge connectors 88, 90 such that, when the DUT board 80 and host board 82 are connect to one another, the DUT board is orthogonal or substantially orthogonal (e.g., at an eighty-five to ninety-five degree angle) to the host board 82.

Additionally, it should be noted that one or both of the connectors 84, 86 may be connectors associated with other communication or transport protocols or interfaces (e.g., Ethernet, Serial Peripheral Interface (SPI), low-voltage differential signaling (LVDS), I²C (Inter-Integrated Circuit) bus, JTAG (Joint Test Action Group) interfaces, Avalon® Streaming (Avalon-ST or AVST) Serial Peripheral Interface (SPI), embedded MultiMediaCard (eMMC), Secure Digital (SD), or any other suitable communication or transport protocols or interfaces) or any suitable physical layer interconnect material (e.g., copper, fiber, waveguide/optical, etc.), and the edge connectors 88, 90 may be any edge connector that interfaces with the connectors 84, 86 (e.g., can be inserted into the connectors 84, 86). For instance, in one embodiment, the connector 84 may be a PCIe connector, and the connector 86 may be a different type of connector. In such an embodiment, the edge connector 88 may be a PCIe edge connector, and the edge connector 90 may not be a PCIe edge connector but rather an edge connector compatible with the connector 86. Furthermore, the DUT board 80 may include features that allow for a hardwired connection to a computing system, separate from the testing center 60. The DUT board 80 may also have components that allow for a physical connection to another circuit board or structure (e.g., expansion card) other than the host board 82. Accordingly, data from the DUT board 80 (e.g., data generated by, or associated with, the integrated circuit 12) may be communicated to the host board 82 via the edge connectors 88, 90 interfacing with the connectors 84, 86.

An edge 92 of the connector 84 may be displaced a certain distance below an edge 94 of the connector 86 as indicated by line 96. In other words, the connectors 84, 86 be offset from one another by a width (e.g., distance) indicated by line 96. As discussed below, the edge connectors 88, 90 of the DUT board 80 may have been recessed from one another to enable to the edge connectors 88, 90 of the DUT board 80 to be inserted into the connectors 84, 86 of the host board 82.

Figure 5:
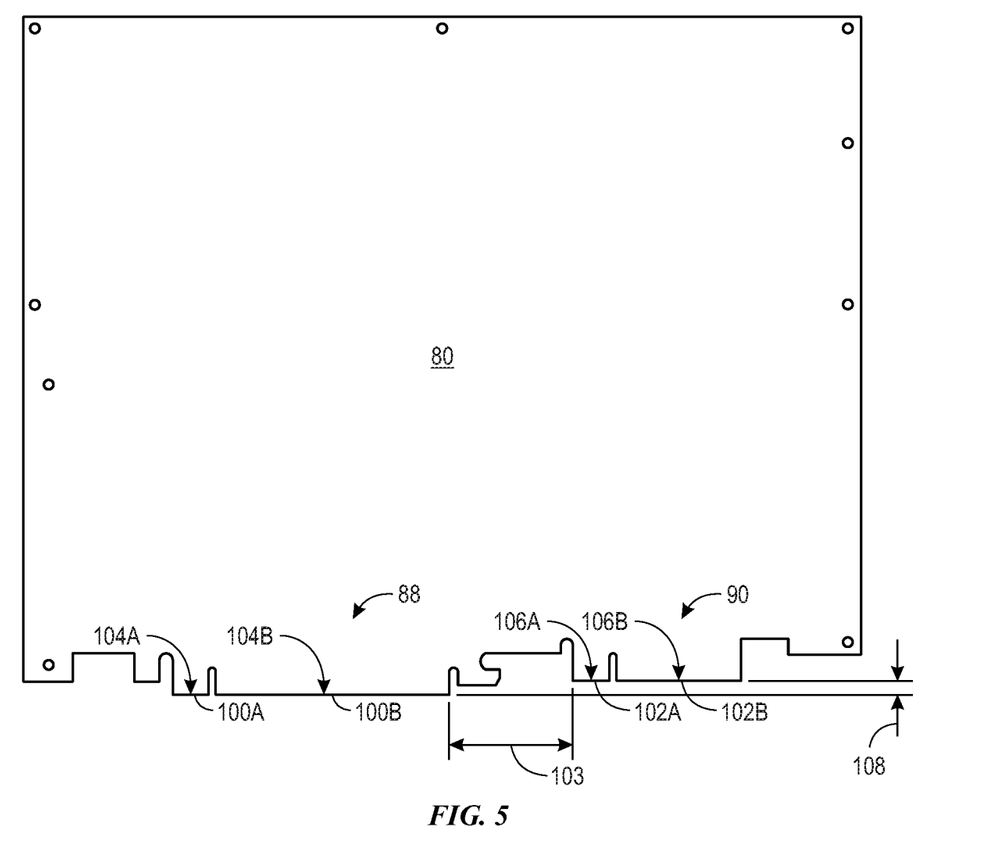
FIG. 5 is a diagram of a DUT board of FIG. 4, in accordance with an embodiment.

Bearing this in mind, FIG. 5 illustrates the DUT board 80 and the edge connectors 88, 90 of the DUT board 80. As illustrated, the edge connector 88 includes edge fingers 100A, 100B, and the edge connector 90 includes edge fingers 102A, 102B. The edge fingers 100A, 100B may be inserted into the connector 84 of the host board 82, and the edge fingers 102A, 102B may be inserted into the connector 86 of the host board 82. The edge finger 100B of the edge connector 88 and the edge finger 102A of the edge connector are separated from one another by a distance 103. In one embodiment, the distance 103 may be 37.3 millimeters. In another embodiment, the distance 103 may range from 37.0 to 37.6 millimeters. In other embodiments, the distance 103 may be any suitable distance that enables the edge connector 88 and edge connector 90 to be inserted into the host board 82.

As also illustrated, the edge fingers 100A, 100B of the edge connector 88 extend from a side of the DUT board 80 farther than the edge fingers 102A, 102B of the edge connector 90 extend from the same side of the DUT board 80. In particular, edges 104A, 104B of the edge fingers 100A, 100B are offset from edges 106A, 106B of the edge fingers 102A, 102B by a recession 108. In other words, the edge connector 90 is displaced by the edge connector 88 by a measurement (e.g., width) equal to the recession 108. In one embodiment, the recession 108 may be approximately 4.6 millimeters. In another embodiment, the recession 108 may fall within a range of measurements, such as approximately 2.0 millimeters to 7.5 millimeters. In yet another embodiment, the recession 108 be made any suitable measurement in which the edge connector 88 and edge connector 90 are displaced from one another (e.g., a distance greater than 0 millimeters).

By including the edge connector 90 on the DUT board 80 in a displaced manner, the DUT board 80 may be physically and communicatively coupled to the host board 82 in two places (e.g., connectors 84, 86). Because the DUT board 80 has multiple connections to the host board 82, data may be communicated between components on the DUT board 80 (e.g., the integrated circuit 12) and components on the host board 82 (e.g., one or more other integrated circuits) compared to DUT boards that use a single connection. For example, compared to an embodiment of the DUT board 80 that only includes that edge connector 88, the DUT board 80 of FIG. 5 may enable different or more types of data to be communicated by utilizing the edge connector 90. Accordingly, inclusion of the edge connector 88 may improve the quality and/or increase the number of types of testing associated with the integrated circuit 12 and the design software 14 performed in the testing system 58.

Furthermore, due to the offset 108 between the edge connectors 88, 90, the DUT board 80 may be coupled via the edge connector 88 to certain circuit boards without obstructing components of the circuit boards. For example, the DUT 80 may be coupled to another circuit board or electronic device that includes a connector 84 but not the connector 86. In such a case, the edge connector 90 will not obstruct a component of the circuit board that extends into space parallel to the connector 84. For instance, the DUT board 80 may be connected to a motherboard (e.g., a motherboard used in a desktop computer or server) or riser card via the edge connector 88 without the edge connector 90 obstructing components of the motherboard, the riser card, or a circuit board into which the riser card is inserted.

Additionally, it should be noted that the edge fingers 106A, 106B may be designed as a breakaway test-coupon. For example, the edge fingers 106A, 106B may be removable from DUT board 80 after pre-production testing is completed so that the DUT board 80 may be provided to another entity (e.g., a customer) as a production quality printed circuit board that includes a single connection (e.g., the edge connector 88). Furthermore, in some cases, such as cases in which the edge connector 90 may obstruct the DUT board 80 (e.g., relative to the host board 82 or a component thereof), the edge fingers 106A, 106B may be removed to mitigate such an obstruction.

It should be noted that the edge connectors 88, 90 may not be the only point of connection of the DUT board 80 and the host board 82. That is, the DUT board 80 may connect to the host board 82 via one or more ports or connectors other than the edge connectors 88, 90.

EXAMPLE EMBODIMENTS

Example Embodiment 1

A circuit board, comprising:
a first edge connector configured to communicatively couple the circuit board to a first connector of a second circuit board, wherein the first edge connector extends from a side of the circuit board a first length; and
a second edge connector configured to communicatively couple the circuit board to a second connector of the second circuit board, wherein the second edge connector extends from the side of the circuit board a second length that is different than the first length.

Example Embodiment 2

The Circuit Board of Example Embodiment 1, wherein the circuit board comprises a device under test (DUT) board configured to receive a device under test, wherein the device under test comprises an integrated circuit.

Example Embodiment 3

The circuit board of example embodiment 2, wherein the integrated circuit comprises a programmable logic device.

Example Embodiment 4

The circuit board of example embodiment 3, wherein the programmable logic device comprises a field-programmable gate array (FPGA).

Example Embodiment 5

The circuit board of example embodiment 1, wherein:
the first edge connector is configured to provide a first number of data lanes;
the second edge connector is configured to provide a second number of data lanes; and
the first and second numbers of data lanes are different.

Example Embodiment 6

The circuit board of example embodiment 1, wherein:
the first edge connector comprises a first peripheral component interconnect express (PCIe) connector; and
the second edge connector comprises a second PCIe connector.

Example Embodiment 7

The circuit board of example embodiment 6, wherein:
the first PCIe connector comprises a PCIe x16 connector; and
the second PCIe connector comprises a PCIe x8 connector.

Example Embodiment 8

The circuit board of example embodiment 1, wherein:
the first edge connector comprises a peripheral component interconnect express (PCIe) connector; and
the second edge connector comprises a connector other than a PCIe connector.

Example Embodiment 9

The circuit board of example embodiment 1, wherein a recession equal to a difference between the first length and the second length measures 2.0 to 7.5 millimeters.

Example Embodiment 10

The circuit board of example embodiment 9, wherein the recession measures 4.0 to 5.0 millimeters.

Example Embodiment 11

The circuit board of example embodiment 1, wherein the second edge connector comprises a test-coupon that is removable from the circuit board.

Example Embodiment 12

A system comprising:
a first circuit board comprising:
  a first connector configured to receive an edge connector; and
  a second connector configured to receive a different edge connector; and
a second circuit board comprising:
  a first edge connector configured to communicatively couple the second circuit board to the first circuit board, wherein the first edge connector extends from a side of the second circuit board by a first length; and
  a second edge connector configured to communicatively couple the second circuit board to the first circuit board, wherein the second edge connector extends from the side of the second circuit board by a second length that is different than the first length.

Example Embodiment 13

The system of example embodiment 12, wherein the second circuit board comprises a device under test (DUT) board configured receive a device under test, wherein the device under test comprises a programmable logic device.

Example Embodiment 14

The system of example embodiment 13, wherein:
the first connector comprises a first right-angle connector; and
the second connector comprises a second right-angle connector.

Example Embodiment 15

The system of example embodiment 13, wherein the second circuit board is configured to be connected substantially orthogonal to the first circuit board when the first edge connector is inserted into the first connector and the second edge connector is inserted into the second connector.

Example Embodiment 16

The system of example embodiment 13, wherein the programmable logic device comprises a field-programmable gate array (FPGA).

Example Embodiment 17

The system of example embodiment 12, wherein:
the first edge connector comprises a first peripheral component interconnect express (PCIe) connector; and
the second edge connector comprises a second PCIe connector.

Example Embodiment 18

The system of example embodiment 17, wherein the first PCIe connector comprises a PCIe x16 connector and the second PCIe connector comprises a PCIe x8 connector.

Example Embodiment 19

A circuit board, comprising:
a first peripheral component interconnect express (PCIe) connector configured to be inserted into a first connector of a second circuit board, wherein the first PCIe connector extends from a side of the circuit board a first length, wherein the first PCIe connector comprises a PCIe x16 connector; and
a second PCIe connector configured to be inserted into to a second connector of the second circuit board, wherein the second PCIe connector extends from the side of the circuit board a second length that is less than the first length, wherein the second PCIe connector comprises a PCIe x8 connector.

Example Embodiment 20

The circuit board of example embodiment 19, wherein the circuit board is a device under test (DUT) board configured to receive a programmable logic device as a device under test.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A circuit board, comprising:
a first edge connector configured to communicatively couple the circuit board to a first connector of a second circuit board, wherein the first edge connector extends from a side of the circuit board a first length; and
a second edge connector configured to communicatively couple the circuit board to a second connector of the second circuit board, wherein the second edge connector extends from the side of the circuit board a second length that is different than the first length, wherein the first edge connector and the second edge connector extend from the same side of the circuit board, and wherein the first edge connector is offset from the second edge connector by a recession, wherein the first edge connector and the second edge connector terminate in different planes.

2. The circuit board of claim 1, wherein the circuit board comprises a device under test (DUT) board configured to receive a device under test, wherein the device under test comprises an integrated circuit.

3. The circuit board of claim 2, wherein the integrated circuit comprises a programmable logic device.

4. The circuit board of claim 3, wherein the programmable logic device comprises a field-programmable gate array (FPGA).

5. The circuit board of claim 1, wherein:
the first edge connector is configured to provide a first number of data lanes;
the second edge connector is configured to provide a second number of data lanes; and
the first and second numbers of data lanes are different.

6. The circuit board of claim 1, wherein:
the first edge connector comprises a first peripheral component interconnect express (PCIe) connector; and
the second edge connector comprises a second PCIe connector.

7. The circuit board of claim 6, wherein:
the first PCIe connector comprises a PCIe x16 connector; and
the second PCIe connector comprises a PCIe x8 connector.

8. The circuit board of claim 1, wherein:
the first edge connector comprises a peripheral component interconnect express (PCIe) connector; and
the second edge connector comprises a connector other than a PCIe connector.

9. The circuit board of claim 1, wherein the recession is equal to a difference between the first length and the second length, wherein the recession measures 2.0 to 7.5 millimeters.

10. The circuit board of claim 9, wherein the recession measures 4.0 to 5.0 millimeters.

11. The circuit board of claim 1, wherein the second edge connector comprises a test-coupon that is removable from the circuit board.

12. A system comprising:
a first circuit board comprising:
a first connector configured to receive an edge connector; and
a second connector configured to receive a different edge connector; and
a second circuit board comprising:
a first edge connector configured to communicatively couple the second circuit board to the first circuit board, wherein the first edge connector extends from a side of the second circuit board by a first length; and a second edge connector configured to communicatively couple the second circuit board to the first circuit board, wherein the second edge connector extends from the side of the second circuit board by a second length that is different than the first length, wherein the first edge connector and the second edge connector extend from the same side of the second circuit board, and wherein the first edge connector is offset from the second edge connector based on a difference between the first length and the second length.

13. The system of claim 12, wherein the second circuit board comprises a device under test (DUT) board configured receive a device under test, wherein the device under test comprises a programmable logic device.

14. The system of claim 13, wherein:
the first connector comprises a first right-angle connector; and
the second connector comprises a second right-angle connector.

15. The system of claim 13, wherein the second circuit board is configured to be connected substantially orthogonal to the first circuit board when the first edge connector is inserted into the first connector and the second edge connector is inserted into the second connector.

16. The system of claim 13, wherein the programmable logic device comprises a field-programmable gate array (FPGA).

17. The system of claim 12, wherein:
the first edge connector comprises a first peripheral component interconnect express (PCIe) connector; and
the second edge connector comprises a second PCIe connector.

18. The system of claim 17, wherein the first PCIe connector comprises a PCIe x16 connector and the second PCIe connector comprises a PCIe x8 connector.

19. A circuit board, comprising:
a first peripheral component interconnect express (PCIe) connector configured to be inserted into a first connector of a second circuit board, wherein the first PCIe connector extends from a side of the circuit board a first length, wherein the first PCIe connector comprises a PCIe x16 connector; and
a second PCIe connector configured to be inserted into to a second connector of the second circuit board, wherein the second PCIe connector extends from the side of the circuit board a second length that is less than the first length, wherein the first PCIe connector and the second PCIe connector extend from the same side of the circuit board, wherein the first PCIe connector and the second PCIe connector extend from the side of the circuit board in parallel, wherein the first PCIe connector is offset from the second PCIe connector in a first direction and a second direction, wherein the first direction and the second direction are perpendicular to each other, and wherein the second PCIe connector comprises a PCIe x8 connector.

20. The circuit board of claim 19, wherein the circuit board is a device under test (DUT) board configured to receive a programmable logic device as a device under test.

* * * * *